United States Patent [19]
Butler

[11] Patent Number: 5,521,553
[45] Date of Patent: May 28, 1996

[54] METHOD FOR CONTROLLING AN OUTPUT STAGE OF A BIPOLAR MICRO-POWER RAIL-TO-RAIL AMPLIFIER

[75] Inventor: James R. Butler, San Jose, Calif.

[73] Assignee: Analog Devices, Inc., Norwood, Mass.

[21] Appl. No.: 468,527

[22] Filed: Jun. 6, 1995

[51] Int. Cl.$^6$ .................................. H03F 3/30; H03F 3/45
[52] U.S. Cl. ........................... 330/265; 330/255; 330/257; 330/267
[58] Field of Search .................................... 330/255, 257, 330/265, 267, 268

[56] References Cited

U.S. PATENT DOCUMENTS

| | | | |
|---|---|---|---|
| 4,570,128 | 2/1986 | Monticelli | 330/267 |
| 5,442,320 | 8/1995 | Kunst et al. | 330/267 |

OTHER PUBLICATIONS

"Precision Rail–to–Rail Input & Output Operational Amplifier", OP284/OP484, Analog Devices, Inc., 1995.
Vyne et al., "A Quad Low Voltage Rail–to–Rail Operational Amplifier," *IEEE 1992 Bipolar Circuits and Technology Meeting*, CH 3177–Mar. 1992, pp. 242–245.
Goodenough, "Circuit Lets IC Op Amp Handle ±0.9–V Rail–to–Rail Signals", *Electronic Design*, p. 31, Oct. 1, 1992.
"TLC2262, TLC2262A, TLC2262Y Advanced LinCMOS Rail–to–Rail Dual Operational Amplifers", Texas Instruments Incorporated, pp. 1–2, 1994.
"LMC7101 Tiny Low Power Operational Amplifier With Rail–To–Rail Input and Output", National Semiconductor Corporation, TL/H/11991, Jun. 1994.
"Micropower Single–Supply Rail–to–Rail Input/Output Op Amp", OP191/OP291/OP491, Analog Devices, Inc., Oct. 28, 1994.
"Rail–to–Rail Operational Amplifier", Motorola Semiconductor Technical Data, MC33201/2/4, Rev. 3.0, pp. 1–7, 1992.
"LM107/LM207/LM307 Operational Amplifiers", National Semiconductor Corporation, pp. 3–371–3–373, 1989.
"LM101A/LM201A/LM301A Operational Amplifiers", National Semiconductor Corporation, pp. 3–361–3–367, 1989.

*Primary Examiner*—James B. Mullins
*Attorney, Agent, or Firm*—Koppel & Jacobs

[57] ABSTRACT

A bipolar micro-power rail-to-rail operational amplifier has a low complexity output stage that provides a high ratio of load current to no load idle current. The output stage includes first and second output transistors of opposite conductivities whose current circuits are connected in series at the output terminal between high and low voltage supplies. A control transistor responds to the drive voltage at its base by modulating the base-emitter voltages of the first output transistor and a gain transistor in opposite directions to modulate their respective output and gain currents. A regenerative current source supplies current to the gain transistor by returning the gain current in a regenerative feedback loop to its emitter so that the current source idles at a low gain current but is capable of supplying much higher gain currents. A voltage element responds to the gain current by applying a control voltage to the base of the second output transistor so that the output transistors' output currents are unbalanced thereby generating an output current at the output terminal.

7 Claims, 5 Drawing Sheets

METHOD FOR CONTROLLING AN OUTPUT STAGE OF A BIPOLAR MICRO-POWER RAIL-TO-RAIL AMPLIFIER

BACKGROUND OF THE INVENTION

1. Field of the Invention

The present invention generally relates to bipolar micro-power rail-to-rail amplifiers, and more specifically to a method for controlling a micro-power output stage so that it is capable of delivering a high ratio of load current to no load idle current.

2. Description of the Related Art

Battery powered amplifiers may spend long periods of time in an "idle" condition with no input signal, or with intermittent input signals as in the case of voice signals. Power dissipated in these idle periods is wasted and may shorten the lifetime of the battery.

The output stage of a rail-to-rail amplifier is designed to deliver a specified amount of signal power to a load and to consume low power during the idle periods. A standard measure for an amplifier's power consumption is its no load idle current. Present bipolar output stages contribute at least 100 µA of no load idle current and require a relatively large number of components to deliver the desired signal gain, suitably an open loop gain of one million and a closed loop gain of one. The amount of power dissipated during idle periods is too high for applications such as battery powered instrumentation and telecommunication equipment. Furthermore, the number of components and heat dissipation requirements increase the physical dimensions of the integrated circuit, which increases its cost.

Analog Devices, Inc. produces a "Precision Rail-to-Rail Input & Output Operational Amplifier" OP284 that has the ability to swing rail-to-rail at both the input and output. The OP284 has a low supply current of approximately 800µ per amplifier at room temperature. The OP284's output stage uses a constant current source to supply the gain current needed to achieve sufficient signal gain, and hence idles at a relatively high current level.

Analog Devices, Inc. also produces a "Micropower Single-Supply Rail-to-Rail Input/Output Op Amp" OP291. The OP291 has a low supply current of 300µ per amplifier and consumes a quiescent current of 600µ. The OP291's output stage uses output transistor that have 180x relative emitter sizes to achieve the desired gain. This requires a lot of space on the chip. Furthermore, the output stage requires a high number of components.

SUMMARY OF THE INVENTION

The present invention seeks to provide a bipolar micro-power rail-to-rail operational amplifier having a low complexity output stage that provides a high ratio of output load current to no load idle current.

This is accomplished with a dual differential input stage that converts a rail-to-rail input voltage into dual differential currents, a transimpedance stage that converts the differential currents into a single ended drive voltage at a gain node, and an output stage that amplifies changes in the drive voltage to produce a rail-to-rail output voltage at an output terminal.

The output stage includes first and second output transistors of opposite conductivities whose current circuits are connected in series at the output terminal between high and low voltage supplies. A gain transistor has a base that is held at a constant reference voltage, an emitter that is connected to the base of the npn, and a collector that conducts a gain current. A regenerative current source supplies current to the gain transistor by returning the gain current in a regenerative feedback loop to its emitter so that the current source idles at a low current but is capable of supplying much higher currents. A voltage element responds to the gain current by applying a control voltage that varies approximately logarithmically at low gain currents and approximately linearly at high gain currents, to the base of the second output transistor so that its output current varies approximately proportional to the gain current at low levels and as an approximately exponential function of said gain current at high levels.

A control transistor having a base, a collector and an emitter that is connected to the base of said first output transistor and the emitter of said gain transistor. The control transistor responds to the drive voltage at its base by modulating the base-emitter voltages of the first output and gain transistors in opposite directions so that their output currents are unbalanced thereby generating a load current at the output terminal which adjusts the output voltage. The control transistor also conducts a control current that stabilizes the feedback loop.

For a better understanding of the invention, and to show how the same may be carried into effect, reference will now be made, by way of example, to the accompanying drawings.

DETAILED DESCRIPTION OF THE INVENTION

Figure 1:
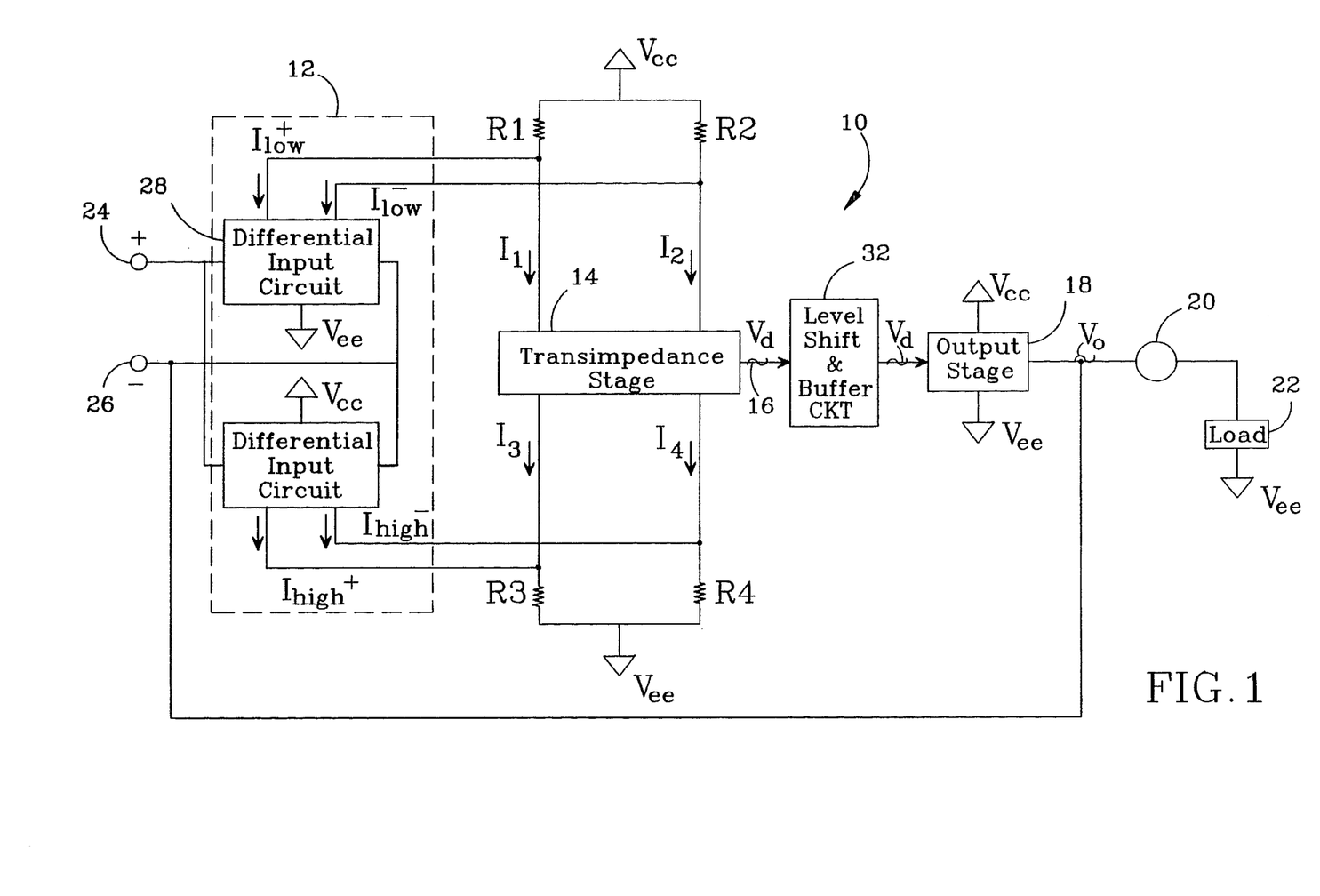
FIG. 1 is a block diagram of a micro-power rail-to-rail operational amplifier in accordance with the present invention.

As shown in FIG. 1, a micro-power rail-to-rail operational amplifier (opamp) 10 includes a transconductance input stage 12 that converts a rail-to-rail differential input voltage signal $V_{in}$ into dual differential currents $I_{low}^{+}$, $I_{low}^{-}$ and $I_{high}^{+}$, $I_{high}^{-}$, a transimpedance stage 14 that converts the differential currents into a single ended drive voltage $V_d$ at a gain node 16, and an output stage 18 that amplifies changes in $V_d$ to produce a rail-to-rail output voltage $V_o$ at an output terminal 20. As shown, amplifier 10 is a single-sided supply amplifier having a high supply voltage $V_{cc}$ of 5 V and a low supply voltage $V_{ee}$ of ground potential. An external load 22 is preferably connected between output terminal 20 and $V_{ee}$. The input and transimpedance stages suitably provide 60 dB of gain, and output stage 18 suitably provides another 60 dB of gain. Hence, amplifier 10, operating open loop, would produce a 1 V output voltage $V_o$ in response to a 1µ differential input voltage $V_{in}$.

In practice, $V_{in}$ is applied to the input stage's non-inverting terminal 24 and output terminal 20 is connected to the input stage's inverting terminal 26 to provide negative feedback that forces output voltage $V_o$ to substantially follow $V_{in}$. An error voltage $V_e = (V_{in} - V_o)$ of between approximately 0 and 5 µV is maintained across the input terminals so that the output voltage $V_o$ follows $V_{in}$. In this closed loop configuration, amplifier 10 is a broadband unity gain amplifier with low signal distortion that delivers a controlled amount of signal power to external load 22.

Amplifier 10 is said to be in balance when it delivers zero load current. Under no load conditions, amplifier 10 can not source any load current, and hence is always balanced. Under load conditions, amplifier 10 is only balanced when $V_o = V_{ee}$. During idle periods, $V_o$ will fall to near $V_{ee}$ but will not be perfectly balanced due to practical limitations in the output stage. In the preferred embodiment of the invention, amplifier 10 supplies a maximum of approximately 5 mA of load current $I_L$ to load 22 while drawing a no load idle current of only approximately 50 µA so that the amplifier consumes a low amount of power during idle periods.

Input stage 12 preferably includes a pair of differential input circuits 28 and 30, which have identical circuit topologies except that their transistor conductivities are reversed. Input circuit 28 operates for input voltages $V_{in}$ down to $V_{ee}$, but shuts down when $V_{in}$ gets to within two diode voltages of a high supply voltage $V_{cc}$. Similarly, input circuit 30 operates for input voltages $V_{in}$ up to $V_{cc}$ but shuts down when $V_{in}$ gets to within two diode voltages of $V_{ee}$. Together input circuits 28 and 30 allow $V_{in}$ to swing between approximately the low and high supply voltages $V_{ee}$ and $V_{cc}$, respectively, without clipping. Both input circuits are turned on over a majority of the input signal range and one of the two are turned on when $V_{in}$ approaches one of the supply voltages. Alternately, the input circuits could be controlled so that only one was turned on at a time.

Input circuits 28 and 30 produce differential currents $I_{low}^+$, $I_{low}^-$ and $I_{high}^+$, $I_{high}^-$. Under no load conditions amplifier 10 does not supply load current at output terminal 20 and is said to be in balance so that these currents are equal. Under loaded conditions, the differential currents are imbalanced to supply load current In at terminal 20 and maintain $V_o$ at substantially $V_{in}$. When driving load 22, input circuits 28 and 30 respond to changes in $V_{in}$, and hence $V_e$ by adjusting differential currents $I_{low}^+$ and $I_{high}^+$ so that they move in opposite directions and adjusting $I_{low}^-$ and $I_{high}^-$ so that they move in opposite directions to modulate the load current supplied at terminal 20. The negative feedback maintains the differential currents at approximately their no load values.

Transimpedance stage 14 responds to changes in the differential currents produced by input stage 12 by reducing drive voltage $V_d$ over a range of approximately 0 to 5 mV relative to a known reference voltage to produce a drive current at gain node 16. Input circuit 28 and a high side of transimpedance stage 14 are tied through resistors R1 and R2 to $V_{cc}$ to supply differential currents $I_{low}^+$, $I_{low}^-$ to input circuit 28 and currents $I_1$, $I_2$ to the transimpedance stage. Similarly, input circuit 30 and a low side of transimpedance stage 14 are tied through resistors R3 and R4 to $V_{ee}$ to draw differential currents $I_{high}^+$, $I_{high}^-$ from input circuit 30 and currents $I_3$, $I_4$ from the transimpedance stage. Under no load conditions, currents $I_1$ through $I_4$ are substantially the same and drive voltage $V_d$ remains at the reference voltage so that the drive current at gain node 16 remains constant. Under loaded conditions, the differential currents are imbalanced which reduces drive voltage $V_d$ and the amount of drive current supplied at gain node 16.

Transimpedance stage 14 is designed so that the voltages across resistors R1 and R2 are substantially constant. Therefore, changes in $I_{low}^+$ and $I_{low}^-$ induce equal and opposite changes in $I_1$ and $I_2$. Transimpedance stage 14 forces $I_3$ to be substantially equal to $I_1$ so that changes in $I_{low}^+$ and $I_{high}^+$ adjust the voltage across resistor R3 to reflect the change in $V_{in}$.

Transimpedance stage 14 is further designed so that the voltage across resistor R4 tries to follow the voltage across R3. This causes currents $I_2$ and $I_4$ to move in opposite directions in response to a change in $V_{in}$ thereby modulating drive voltage $V_d$ relative to the reference voltage and adjusting the drive current at gain node 16.

Drive voltage $V_d$ is preferably applied to a buffer circuit 32, which shifts $V_d$ towards the low supply $V_{ee}$ by an amount substantially equal to the nominal voltage across resistor R3. This is done to set the value of $V_d$ at balance to the particular reference voltage level and to reduce the amplifier's offset voltage. Circuit 32 also buffers the transimpedance stage so that it does not have to directly supply the drive current to output stage 18.

Output stage 18 responds to the level shifted and buffered voltage signal, also referred to as $V_d$, by supplying load current $I_L$ at output terminal 20 to produce output voltage signal $V_o$ across external load 22. Output stage 18 uses a regenerative current source to provide an internal gain current that is used to control signal gain. The regenerative current source supplies the gain current in a regenerative feedback loop so that the gain current can vary over a wide range, approximately 0 µA to approximately 110 µA, in response to changes in drive voltage $V_d$. This allows output stage 18 to supply the large amount of gain current needed to provide a high gain output stage while idling under no load conditions at approximately 3 µA. Under loaded conditions, the regenerative current source will idle at a somewhat higher level because in practice output stage 18 can not be driven all the way to ground, and hence a small current will flow through the load.

By supplying gain current as it is demanded by changes in $V_{in}$, output stage 18 lowers the average power consumed by the amplifier without sacrificing performance. In the preferred embodiment amplifier 10 consumes a total no load idle current of approximately 50 µA with only approximately 8 µA being consumed by the output stage. The maximum load current is 5 mA so that the ratio of load current to no load idle current is approximately one thousand. Furthermore, the regenerative current source is self-limiting, which prevents the gain current from increasing unchecked in response to an extreme variation in $V_d$ and destroying the amplifier. The regenerative current source requires relatively few components and a moderate amount of chip space.

Figure 2:
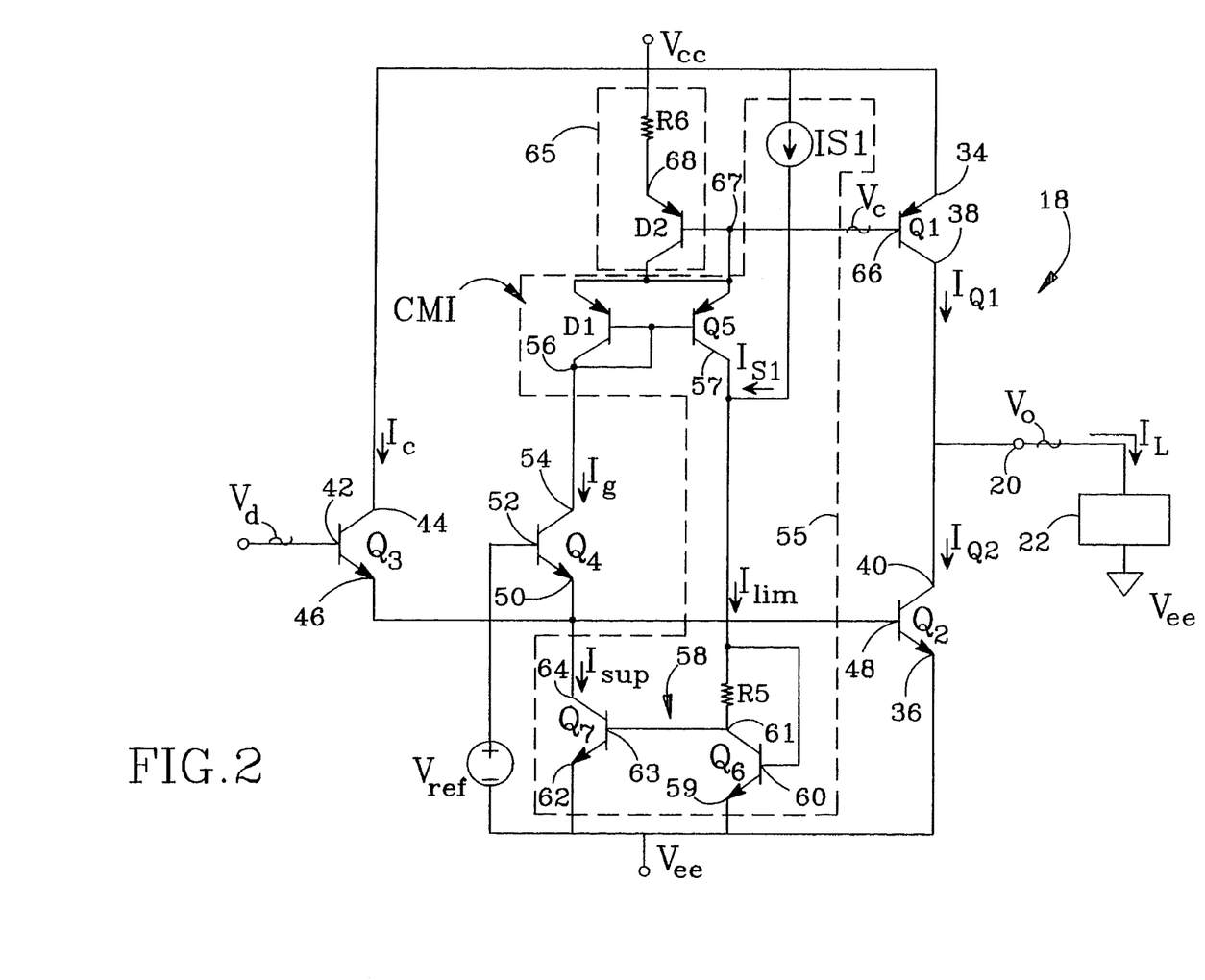
FIG. 2 is a simplified schematic diagram of an output stage for the operational amplifier shown in FIG. 1.

FIG. 2 is a schematic diagram of output stage 18 shown in FIG. 1. Output stage 18 comprises a 10x pnp output transistor Q1 whose emitter 34 is connected to $V_{cc}$ and a 4x npn output transistor Q2 whose emitter 36 is connected to $V_{ee}$. Their collectors 38 and 40 are connected together at output terminal 20. The 10x and 4x designations represent the transistors emitter sizes relative to standard 1x size, and are chosen to provide proper bias conditions for the amplifier. In general, current flows from the supply $V_{cc}$ through transistors Q1 and Q2 and into negative supply $V_{ee}$. Under no load conditions, the collector currents $I_{Q1}$ and $I_{Q2}$ are equal, suitably 4 µA, so that amplifier 10 neither sinks nor supplies a difference current $I_L$ at output terminal 20. Under load conditions, output stage 18 responds to $V_{in}$ by imbalancing the collector currents so that together transistors Q1 and Q2 source load current $I_L$ to load 22 so that $V_o$ follows $V_{in}$. Alternately, if load 22 was connected to $V_{cc}$ instead of $V_{ee}$, transistors Q1 and Q2 would sink current from the load.

Drive voltage $V_d$ is applied to the base 42 of a 1x npn control transistor Q3 whose collector 44 is connected to $V_{cc}$ and conducts a control current $I_c$ and whose emitter 46 is connected to the base 48 of output transistor Q2. Transistors Q2 and Q3 set the reference voltage for $V_d$ at two base-emitter voltages above $V_{ee}$. Control transistor Q3 responds to variations in $V_d$ by adjusting the voltage at base 48 of transistor Q2, which changes its collector current $I_{Q2}$. This imbalances the output transistors' collector currents and adjusts load current $I_L$. Because the change in voltage at base 48 of transistor Q2 is the same as the change in drive voltage $V_d$, the gain provided by transistor Q2 alone is relatively small.

A 1x npn gain transistor Q4 has an emitter 50 that is connected to the emitter 46 of control transistor Q3 for the purpose of sensing changes in $V_d$. A voltage source $V_{ref}$ clamps the voltage at base 52 of transistor Q4 at two base-emitter voltages above $V_{ee}$ so that at balance $V_d$ and $V_{ref}$ are the same and under load conditions $V_d$ is less than $V_{ref}$. Therefore, gain transistor Q4 and output transistor Q2 respond to a change in $V_d$ by adjusting their base-emitter voltages by equal but opposite amounts. Transistor Q4 responds to changes in its base-emitter voltage by adjusting a gain current $I_g$ that flows through its collector 54.

A regenerative current source 55 includes a current mirror CM1 that mirrors gain $I_g$ from collector 54 of gain transistor Q4 to a current limiter 58, which in turn supplies current $I_{sup}$ to emitter 50 of gain transistor Q4. Current mirror CM1 includes a diode D1 that is connected across the base-emitter junction of a 1x pnp transistor Q5. The base/collector 56 of diode D1 is connected to collector 54, and the collector 57 of transistor Q5 is connected to current limiter 58. A constant current source IS1 injects current $I_{s1}$, suitably 1 μA, into the signal path at collector 57 to increase the amount of current $I_{lim}=(I_g+I_{s1})$ that is supplied to current limiter 58. During normal operation, current limiter 58 multiplies the current $I_{lim}$ by a constant factor greater than one, suitably 1.5, and supplies it as current $I_{sup}$ to emitters 50 and 46 of gain and control transistors Q4 and Q3.

If drive voltage $V_d$ is reduced too much, control transistor Q3 turns off so that all of the regenerated current is supplied to gain transistor Q4. Because the signal path has a gain greater than one, gain current $I_g$ if left unchecked would increase without bound and destroy the amplifier. Therefore, current limiter 58 responds to large gain currents $I_g$ by reducing its gain and eventually shutting down to prevent the amplifier from destroying itself.

Current limiter 58 is preferably a current peaking circuit that includes a 1x npn transistor Q6 having an emitter 59 that is tied to $V_{ee}$, a base 60 that is connected to collector 57 of transistor Q5, and a collector 61. A resistor R5, suitably 100 ohms, is connected between base 60 and collector 61. A 1.5x npn transistor Q7 has an emitter 62 that is connected to $V_{ee}$, a base 63 that is tied to collector 61 of transistor Q6, and a collector 64 that is returned to emitter 50 of gain transistor Q4. When gain current $I_g$ is small the voltage across resistor R5 is very small so that transistors Q6 and Q7 act like a current mirror with a gain of 1.5 to supply $I_g$ to gain transistor Q4. As $I_g$ increases, the base-emitter voltage of transistor Q6 increases logarithmically which tends to cause transistor Q7 to increase $I_{sup}$. However, the voltage across resistor R5 increases linearly and drives the voltage at collector 61 of transistor Q6 towards $V_{ee}$ which tends to reduce $I_{sup}$. Thus, current limiter 58 begins to limit at the point where the voltage across resistor R5 increases faster than the base-emitter voltage of transistor Q6. This reduces the base voltage at transistor Q7, which limits current $I_g$.

The regenerative feedback loop is described by a pair of equations that must be satisfied to stabilize output stage 18.

The currents summed at emitter 46 of control transistor Q3, ignoring the base current of transistor Q2 and assuming that the emitter currents of transistors Q3 and Q4 equal their respective collector currents $I_c$ and $I_g$, satisfy:

$$I_{sup}=I_c+I_g \quad (1)$$

The current $I_{sup}$ supplied by current limiter 58 is described by the following feedback equation:

$$I_{sup}=G(I_g+I_{s1}) \quad (2)$$

where G is the gain of current limiter 58, suitably 1.5 during normal operation and progressively smaller as limiting occurs.

At balance, current limiter 58 preferably supplies 3 μA of current ($I_{sup}$=3 μA), which is split between transistors Q3 and Q4 so that $I_c$=2 μA and $I_g$=1 μA. These values satisfy both equations 1 and 2 so that amplifier 10 is stable. Under load conditions, gain transistor Q4 responds to changes in its base-emitter voltage by adjusting $I_g$. Regenerative current source 55 senses the change in $I_g$ and adjusts $I_{sup}$ to supply the required gain current. Control transistor Q3 absorbs any excess current supplied by the regenerative process by adjusting $I_c$ so that equations 1 and 2 are again satisfied.

A current controlled voltage element 65 is connected between current mirror CM1 and $V_{cc}$ so that the current ($2I_g$) drawn from the positive supply to supply current mirror CM1 flows through voltage element 65. Thus, twice the gain current $I_g$ modulates a control voltage $V_c$ at the base 66 of output transistor Q1. Control voltage $V_c$ moves in the same direction as the voltage applied to base 48 of output transistor Q2. Therefore, transistor Q1 adjusts its collector current $I_{Q1}$ in opposition to the change in collector current $I_{Q2}$, which further imbalances output stage 18 and increases drive current $I_L$.

Voltage element 65 includes a diode D2, which is implemented as a diode connected 5x pnp transistor, whose base/collector 67 is connected to base 66 of output transistor Q1 and the input of current mirror CM1. A resistor R6, suitably 2.9K, is connected between $V_{cc}$ and D2's emitter 68. Thus, the base-emitter voltage across output transistor Q1 is the sum of the voltages across resistor R6 and diode D2, which increase linearly and logarithmically, respectively, as gain current $I_g$ increases.

At balance, the voltages across resistor R6 and diode D2 are approximately 5.8 mV and 0.7 V, respectively. Therefore, the diode voltage dominates and the resistor voltage can be ignored. As a result, voltage element 65 mirrors $I_g$ with a fixed amount of gain to output transistor Q1 so that its collector current $I_{Q1}$ is proportional to gain current $I_g$.

However, as gain current $I_g$ increases the voltage drop across resistor R6 becomes progressively more significant, and at some point the change in control voltage $V_c$ becomes approximately linear. Output transistor Q1 responds to a linear change in base-emitter voltage by adjusting its collector current $I_{Q1}$ as an approximately exponential function of gain current $I_g$.

The effect of this is that output transistor Q1 sources a lot more current to load 22 for a given change in drive voltage $V_d$ than output transistor Q2 sinks for an equivalent opposite change in $V_d$. Thus, output stage 18 responds asymmetrically to changes in drive voltage $V_d$ and only provides high gain when sourcing current to the load. Thus, the load is preferably connected to low supply $V_{ee}$ so that output stage 18 never sinks current. Alternately, the high gain output transistor could be used to sink current, in which case the load would be connected to $V_{cc}$. In practice, the nonlinear gain does not matter unless the amplifier is being used for a special application that requires gain linearity. Furthermore, the benefits of reduced no load idle current outweigh the minimal effects of gain non-linearity.

Figure 3A:
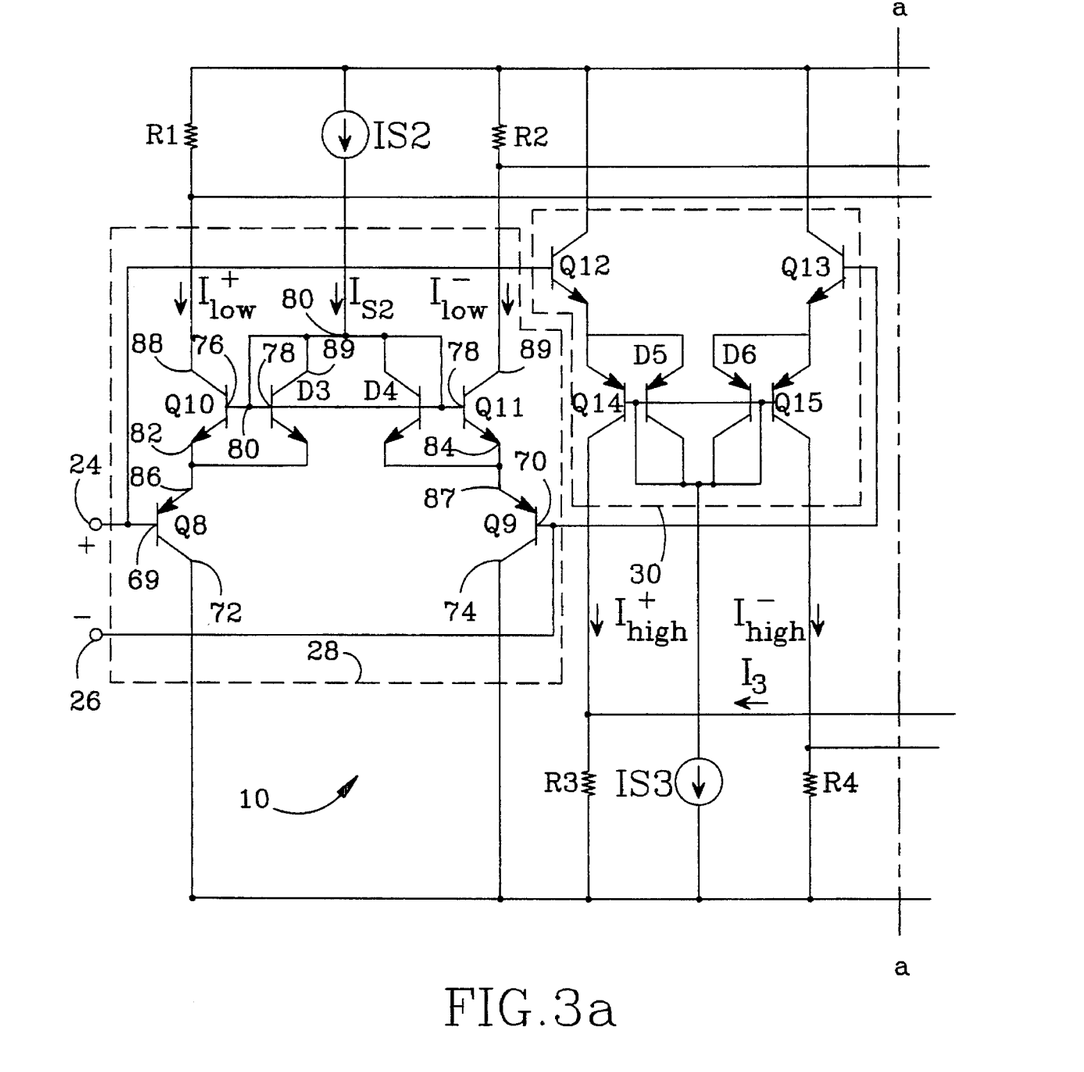
FIGS. 3a, 3b and 3c are together a schematic diagram of a preferred embodiment of the operational amplifier shown in FIG. 1.
Figure 3B:
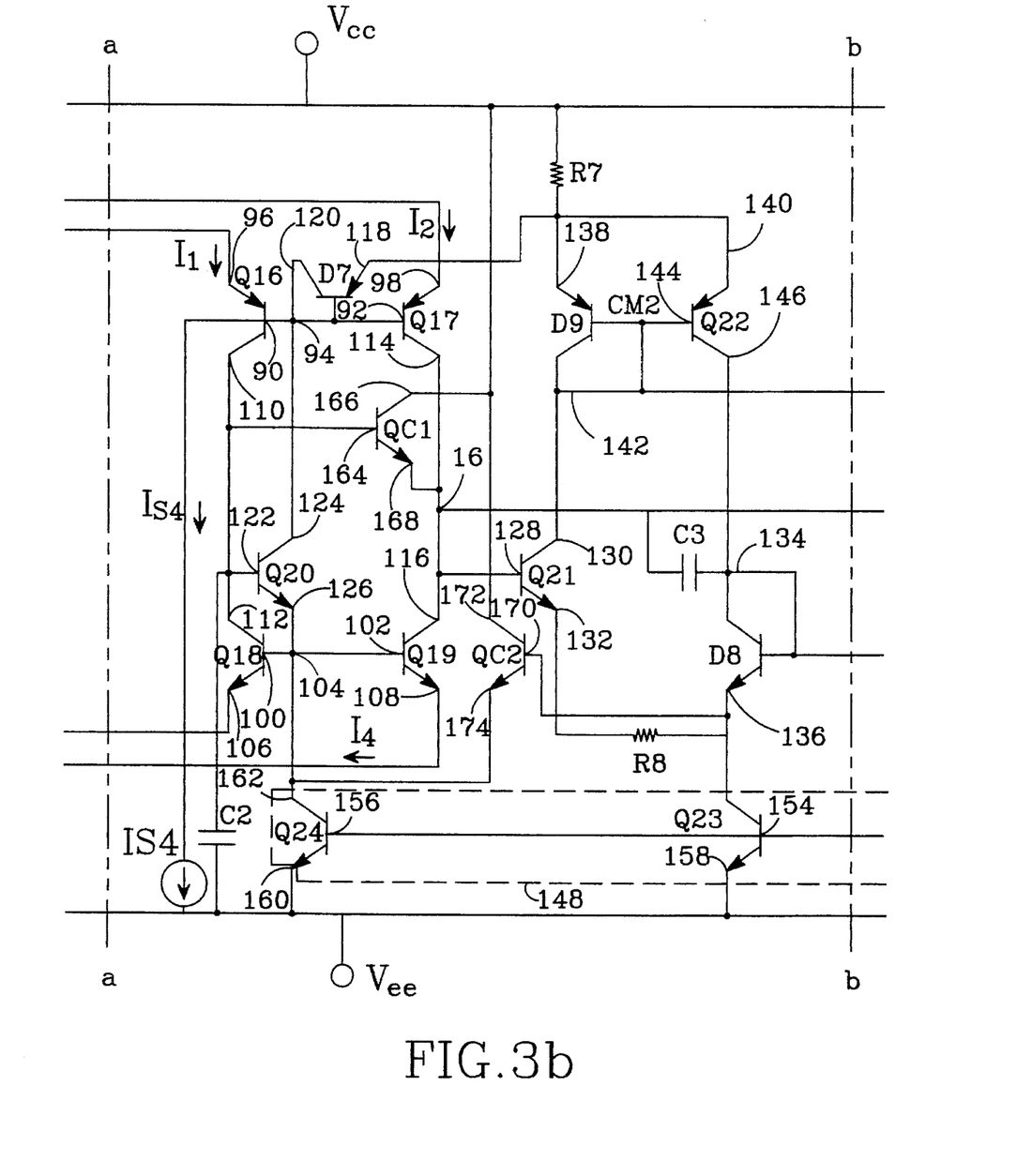
Figure 3C:
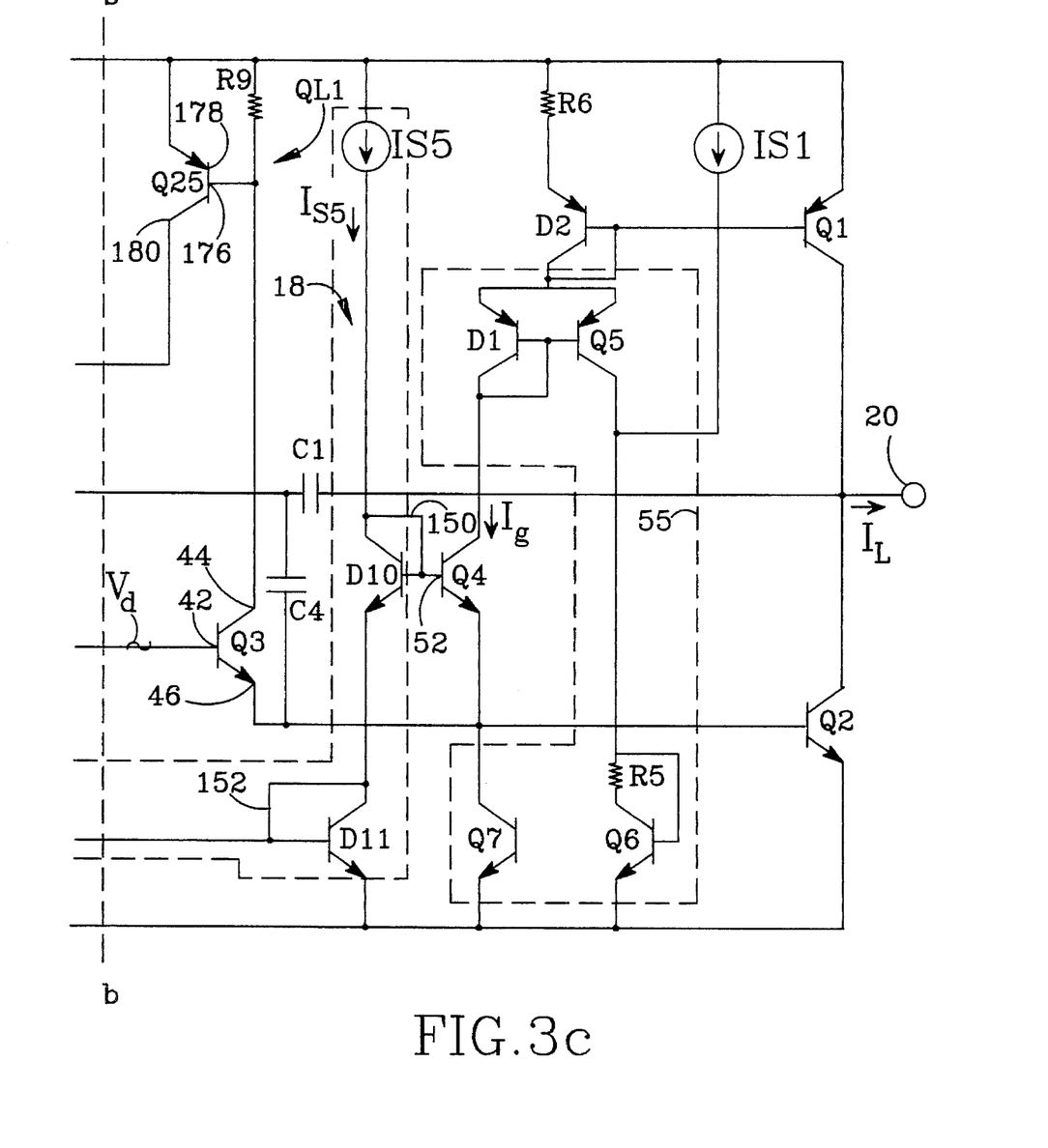

FIGS. 3a, 3b and 3c are together a schematic diagram of a preferred embodiment of amplifier 10 shown in FIG. 1. The preferred input stage 12 is similar to those used in operational amplifiers OP-284 and OP-291 produced by Analog Devices, Inc., the assignee of the present invention. Input circuit 28 comprises a pair of 2x pnp transistors Q8 and Q9 whose bases 69 and 70 provide the non-inverting and inverting inputs 24 and 26, respectively. Their collectors 72 and 74 are connected to $V_{ee}$. A pair of 2x npn transistors Q10 and Q11 have bases 76 and 78 that are tied together at node 80, and emitters 82 and 84 that are connected to the respective emitters 86 and 87 of transistors Q8 and Q9. The collectors 88 and 89 of transistors Q10 and Q11 are connected to resistors R1 and R2 and conduct input currents $I_{low}^+$ and $I_{low}^-$, respectively.

A pair of diodes D3 and D4, which are implemented as diode connected 1x npn transistors, are connected between node 80 and respective emitters 82 and 84 of transistors Q10 and Q11. Thus, currents $I_{low}^+$ and $I_{low}^-$ in transistors Q10 and Q11 are twice the currents in D3 and D4, respectively. A current source IS2 supplies current $I_{s2}$, suitably 1.5 µA, to node 80 to supply transistors Q10 and Q11, and diodes D3 and D4.

At balance, supply current $I_{s2}$ is split equally between the two sides of differential input circuit 28 so that $I_{low}^+$ and $I_{low}^-$ conduct 1.5 µA. Input circuit 28 responds to a relative increase in $V_{in}$ at the base 69 of transistor Q8 (non-inverting terminal 24) by reducing and increasing the voltages across diodes D3 and D4, respectively, so that a smaller portion of $I_{s2}$ flows through diode D3 and a larger portion flows through diode D4. The changes in diode current are reflected into $I_{low}^+$ and $I_{low}^-$.

The topology of input circuit 28 allows $V_{in}$ to swing from the low supply voltage $V_{ee}$ to within two base-emitter voltages of positive supply voltage $V_{cc}$. The base-collector voltages of transistors Q8 and Q9 can operate effectively with zero volts. Therefore, $V_{in}$ can include $V_{ee}$ without turning input circuit 28 off. Conversely, if $V_{in}$ rises to within two base-emitter voltages of $V_{cc}$, the transistors begin turning off.

The input stage's dual input circuits 28 and 30 are identical except for the reversed conductivities of their transistors and diodes, and thus a detailed description of input circuit 30 is omitted. In general, input circuit 30 includes a pair of npn transistors Q12 and Q13 whose bases are tied to the non-inverting and inverting terminals, respectively. A current source IS3 draws a reference current from a pair of diodes D5 and D6. The diodes are connected across the base-emitter junctions of pnp transistors Q14 and Q15, and respond to changes in $V_{in}$ to modulate their collector currents $I_{high}^+$ and $I_{high}^-$ which flow through resistors R3 and R4, respectively.

The preferred transimpedance stage 14 is the folded cascode circuit used in opamp OP-284 produced by Analog Devices, Inc. The folded cascode circuit comprises a pair of 2x pnp transistors Q16 and Q17 having bases 90 and 92 that are connected together at node 94, and emitters 96 and 98 that are connected to resistors R1 and R2 and conduct currents $I_1$ and $I_2$, respectively. A current source IS4 draws a bias current $I_{s4}$, suitably 0.5 µA, from node 94. A pair of 2x npn transistors Q18 and Q19 have bases 100 and 102 that are connected together at node 104, and emitters 106 and 108 that are connected to resistors R3 and R4 and conduct currents $I_3$ and $I_4$, respectively. The collectors 110 and 112 of transistors Q16 and Q18 are connected together and conduct the same current, $I_3=I_1$. The collectors 114 and 116 of transistors Q17 and Q19 are connected at gain node 16 and together source current at gain node 16 in response to changes in $V_{in}$.

The folded cascode circuit establishes a constant voltage drop across resistors R1 and R2, suitably 50K, by fixing the voltage at node 94. A resistor R7, suitably 45K, is connected between $V_{cc}$ and the emitter 118 of a diode D7, which is implemented as a diode connected 1.5x pnp transistor, whose base/collector 120 is connected to node 94. Diode D7 and resistor R7 are biased so that the voltages across resistors R1 and R2 are approximately the same as the voltage across R7. As a result, 4.5 µA of continuous current flows through resistors R1 and R2.

The folded cascode circuit uses a 1x npn transistor Q20 to control transistor Q18 and force $I_3$ to be substantially the same as $I_1$. The base 122 of transistor Q20 is connected to collector 110, its collector 124 is connected to node 94, and its emitter 126 is connected to node 104. If $I_3$ falls below $I_1$, current is driven into base 122 of Q20. This pulls up base 100 of Q18 so that it increases $I_3$. Conversely, if $I_3$ rises above $I_1$, the base drive to Q20 is reduced. This pulls base 100 of Q18 down, which in turn reduces $I_3$.

The result is that the folded cascode circuit drives current $I_3$ through resistor R3, which together with current $I_{high}^+$ from input circuit 30 set the voltage across R3. Currents $I_3$ and $I_{high}^+$ respond to changes in $V_{in}$ by moving in the same direction so that the voltage across R3 reflects that change. The voltage at base 100 of Q18, and hence the voltage at base 102 of Q19 move up and down with the voltage across R3 to keep $I_3$ the same as $I_1$. Transistor Q19 responds to variations of its base voltage by adjusting $I_4$ so that the voltage across R4 tries to follow the voltage across R3.

At balance $I_1=I_2=3$ µA and $I_{high}^+=I_{high}^-=1.5$ µA. Since the folded cascode circuit forces $I_3$ to equal $I_1$, $I_3$ is also 3 µA. Thus, transistor Q19 supplies $I_4$ at 3 µA so that the voltages across resistors R3 and R4 are equal. Because currents $I_2$ and $I_4$ are equal, drive voltage $V_d$ at gain node 16 remains at its reference value and the drive current provided to the next stage is unchanged.

Under load conditions, amplifier 10 reduces $V_d$ relative to its reference voltage so that output stage supplies load current to hold $V_o$ at $V_{in}$. Amplifier 10 responds to an increase in $V_{in}$ by increasing $I_{high}^+$ and $I_1$, and hence $I_3$, and reducing $I_2$ and $I_{high}^-$. This increases the voltage across resistor R3, which in turn increases the voltage at base 102 of transistor Q19. As the voltage across resistor R3 is increased, the voltage across resistor R4 that is attributable to $I_{high}^-$ is reduced. Thus, transistor Q19 increases $I_4$ to pull up the voltage across resistor R4. This pulls the voltage at its collector 116 and at gain node 16 down thereby reducing drive voltage $V_d$ and reducing the drive current. Amplifier 10 responds to a reduction in $V_{in}$ by increasing drive voltage $V_d$ and increasing the drive current at gain node 16.

Buffer circuit 32 is connected between gain node 16 and base 42 of control transistor Q3 in output stage 18. The primary purpose of buffer circuit 32 is to establish a voltage drop equal to the voltage across resistor R3 at balance between collector 116 of transistor Q19 and base 42 of control transistor Q3. This keeps the voltages at the collectors 112 and 116 of transistors Q18 and Q19 approximately equal, which lowers the amplifier's offset voltage. A secondary purpose is to buffer gain node 16 from base 42 of control transistor Q3 so that the change in base current does not have to be provided entirely by transimpedance stage 14.

Buffer circuit 32 includes a 1x npn transistor Q21 having a base 128 that is connected to gain node 16, a collector 130, and an emitter 132 that is connected to one side of a resistor R8. A diode D8, implemented as a 1x diode connected npn transistor, has a base/collector 134 that is connected to base 42 of control transistor Q3 and an emitter 136 that is connected to the other side of resistor R8. Transistor Q21 and diode D8 are biased so that the voltage drop across resistor R8 is approximately equal to the voltage across resistor R3 at balance.

A current mirror CM2 mirrors the collector current in transistor Q21 to the base/collector 134 of diode D8 to provide the base current that drives control transistor Q3. Therefore, a change in base current at transistor Q3 of $\Delta I$ only requires a change in drive current at gain node 16 of $$\frac{\Delta I}{\beta}$$

where $\beta$ is the current gain of transistor Q21. Current mirror CM2 includes a diode D9, implemented as a diode connected 1x pnp transistor, and a 1x pnp transistor Q22. The emitters 138 and 140 of diode D9 and transistor Q22, respectively, are connected to resistor R7 to draw supply current from $V_{cc}$. (This also provides the bias current that sets the voltage across resistor R7). The base/collector 142 of diode D9 is connected to the collector 130 of transistor Q21 and to the base 144 of transistor Q22. Transistor Q22's collector 146 is connected to base/collector 134 of diode D8.

As described above in FIG. 2, output stage 18 responds to drive signal $V_d$ by supplying load current $I_L$ at output terminal 20 to an external load thereby modulating its output voltage $V_o$ between ground and 5 V. Regenerative current source 55 supplies gain current $I_g$ as needed to respond to changes in drive voltage $V_d$ and provide the desired gain. When amplifier 10 is idling, either because input voltage signal $V_{in}$ is not being applied or because the signal pauses momentarily, regenerative current source 55 supplies only a minimal amount of gain current. This lowers the power consumption of amplifier 10 without sacrificing performance. This saves money, lengthens the life of amplifier 10, and reduces the physical dimensions of the amplifier IC.

Amplifier 10 uses a single bias circuit 148 to establish the reference voltage level at the base 52 of transistor Q4 in output stage 18, supply current to buffer circuit 32 and resistor R7, and supply current for diode D7. This is done to conserve current and lower the amplifier's power consumption during idle periods.

A current source IS5 supplies bias current $I_{s5}$, suitably 2 $\mu$A, that flows from high supply $V_{cc}$, through 2x diodes D10 and D11 and into $V_{ee}$. The base/collector 150 of diode D10 is connected to base 52 of transistor Q4. This sets the base voltage at two base-emitter voltages above the low supply $V_{ee}$. The base/collector 152 of diode D11 is connected to the bases 154 and 156 of transistors Q23 and Q24, respectively. Their emitters 158 and 160 are connected to $V_{ee}$.

Transistor Q23 has an emitter area of 3x, and thus supplies 3 $\mu$A of current. This current is split equally between transistor Q21 and diode D8. Transistor Q24 has an emitter area of 1.5x, and thus supplies 1.5 $\mu$A of current that is drawn from high supply $V_{cc}$ through resistor R7, diode D7, transistor Q20, and into its collector 162.

Amplifier 10 conserves current and thus lowers power consumption by recycling the bias currents for use in multiple parts of the amplifier. However, sustained extreme inputs could cause amplifier 10 to self-destruct. To prevent this, a pair of clamps QC1 and QC2 are added to the folded cascode circuit, and a current limiter QL1 is added to output stage 18.

Clamp QC1 is a 1x npn transistor having a base 164 that is connected to transistor Q18's collector 112, a collector 166 that is connected to $V_{cc}$, and an emitter 168 that is connected to transistor Q19's collector 116. In normal operation, the voltages at collectors 112 and 116 are approximately the same so that QC1 is turned off. However, if transistor Q19's collector voltage drops too much, QC1 turns on, which pulls Q19 up and prevents it from saturating.

Clamp QC2 is a 1x npn transistor having a base 170 that is connected to emitter 136 of diode D8, a collector 172 that is tied to $V_{cc}$, and an emitter 174 that is connected to collector 162 of transistor Q24. In normal operation QC2 is turned off. However, if transistor Q17's voltage pulls up too much, it may saturate. This pulls up base 170 of clamp QC2, which turns it on. Thus, the current supplied by transistor Q24 is provided to clamp QC2 instead of diode D7. This turns the folded cascode circuit off until input voltage $V_{in}$ is reduced.

Current limiter QL1 includes a 1x pnp transistor Q25 having a base 176 that is connected to collector 44 of control transistor Q3, an emitter 178 that is tied to $V_{cc}$, and a collector 180 that is connected to collector 130 of buffer transistor Q21. A resistor R9 is connected across the base-emitter junction of transistor Q25. In normal operation, transistor Q25 is off. However, if drive voltage $V_d$, and hence the voltage at base 42 of control transistor Q3 is increased too much, transistor Q25 will turn on and supply the collector current for transistor Q21. This reduces the current in current mirror CM2 which in turn reduces the base drive to transistor Q3 and decreases its base voltage.

Amplifier 10 uses four capacitors C1–C4 to control its frequency response. Capacitor C1, suitably 15 pF, is connected between output terminal 20 and gain node 16. C1 is the primary compensation capacitor and serves three functions. First, C1 provides local negative feedback from the output of the amplifier back to base 42 of control transistor Q3. C1 also provides pole splitting that drives the low and high frequency poles of the amplifier outside its frequency range. Finally, C1 controls the amplifier's slew rate. Capacitor C2 is connected from transistor Q18's collector 112 to $V_{ee}$. C2 reduces the high frequency transconductance of the folded cascode circuit and limits the amplifier's bandwidth. Capacitor C3 is connected between gain node 16 and base/collector 134 of diode D8. C3 stabilizes the amplifier by compensating for the parasitic capacitance at the collector of Q23. Capacitor C4 is connected between gain node 16 and emitter 46 of control transistor Q3. C4 prevents the amplifier from oscillating.

While several illustrative embodiments of the invention have been shown and described, numerous variations and alternate embodiment will occur to those skilled in the art. For example, different input and transimpedance stages could be used with the output stage of the present invention. Such variations and alternate embodiments are contemplated, and can be made without departing from the spirit and scope of the invention as defined in the appended claims.

I claim:

1. A method for controlling a bipolar output stage that comprises first and second output transistors of opposite conductivities having bases, emitters that are respectively connected to first and second supply voltage terminals, and collectors that are connected at an output terminal and conduct respective output currents, the method comprising:

connecting a load between said output terminal and said first supply voltage terminal;

applying a drive voltage signal to the base of said first output transistor to adjust its output current thereby imbalancing said output currents and producing a load current at said output terminal;

generating a gain current in response to said drive voltage signal;

supplying said gain current by feeding it back in a regenerative feedback path so that said gain current can vary over a predetermined range while idling at a lower end of said range; and modulating a control voltage at the base of said second output transistor as an approximately linear function of said gain current so that its output current is approximately an exponential function of said gain current thereby further imbalancing said output currents to increase the gain of said load current.

2. The method of claim 1, wherein supplying said gain current comprises:

mirroring said gain current into said regenerative feedback path;

injecting current into said regenerative feedback path to increase said gain current;

returning said increased gain current to supply said gain current; and adjusting a control current to absorb excess gain current and stabilize said regenerative feedback path.

3. The method of claim 2, wherein returning said increased gain current comprises:

multiplying said increased gain current by a desired gain factor, said gain factor having a value greater than one for gain currents at a lower end of said predetermined range; and progressively reducing said gain factor as said gain current increases thereby limiting the amount of gain current supplied to less than a maximum value.

4. A method for controlling a bipolar output stage that comprises first and second output transistors of opposite conductivities having bases, emitters that are respectively connected to first and second supply voltage terminals, and collectors that are connected at an output terminal and conduct respective output currents, the method comprising:

connecting a load between said output terminal and said first supply voltage terminal;

applying a drive voltage signal to the base of said first output transistor to adjust its output current thereby imbalancing said output currents and producing a load current at said output terminal;

generating a gain current in response to said drive voltage signal;

supplying said gain current by feeding it back in a regenerative feedback path so that said gain current can vary over a predetermined range while idling at a lower end of said range; and modulating a control voltage at the base of said second output transistor by a) adjusting a first voltage as a logarithmic function of said gain currents b) adjusting a second voltage as a linear function of said gain current, and c) summing said first and second voltages to provide said control voltage at the base of said second output transistor so that said control voltage changes approximately logarithmically for gain current at a lower end of said range and changes progressively more linearly as said gain current increases so that the second output transistor's output current is approximately a linear function of said gain current at the lower end of the range and becomes progressively closer to an exponential function of said gain current as said gain current increases thereby further imbalancing said output currents to increase the gain of said load current.

5. A method for controlling a bipolar output stage that comprises first and second output transistors of opposite conductivities having bases, emitters that are respectively connected to first and second supply voltage terminals, and collectors that are connected at an output terminal and conduct respective output currents, said output stage conducting a total idle current, the method comprising:

connecting a load between said output terminal and said first supply voltage terminal;

applying a drive voltage signal to the base of said first output transistor to adjust its output current thereby imbalancing said output currents and producing a load current at said output terminal;

generating a gain current in response to said drive voltage signal;

supplying said gain current by feeding it back in a regenerative feedback path so that when the output stage is idling the gain current idles at a low level and when the output stage is driven the gain current is supplied at a high level that exceeds the output stage's total idle current; and modulating a control voltage at the base of said second output transistor as a function of said gain current to control its output current thereby further imbalancing said output currents to increase the gain of said load current.

6. The method of claim 5, wherein the gain current is supplied in said regenerative feedback path by:

multiplying the gain current by a desired gain factor, said gain factor having a value greater than one for gain currents near said low level; and progressively reducing said gain factor as said gain current increases thereby limiting the amount of gain current supplied to less than a maximum level.

7. The method of claim 5, wherein said control voltage is modulated as an approximately logarithmic function of the gain current near said low level and progressively more linearly as the gain current increases.

* * * * *